United States Patent
I et al.

(10) Patent No.: US 10,477,710 B2
(45) Date of Patent: Nov. 12, 2019

(54) ELECTRONIC MODULE WITH AN IMPROVED SHELL AND METHOD FOR MAKING THE SAME

(71) Applicants: LITE-ON ELECTRONICS (GUANGZHOU) LIMITED, Guangzhou (CN); LITE-ON TECHNOLOGY CORP., Taipei (TW)

(72) Inventors: Ya-Tung I, Taipei (TW); Chien-Hua Chu, Taipei (TW)

(73) Assignees: Lite-On Electronics (Guangzhou) Limited, Guangzhou (CN); Lite-On Technology Corp., Taipei (TW)

( * ) Notice: Subject to any disclaimer, the term of this patent is extended or adjusted under 35 U.S.C. 154(b) by 0 days.

(21) Appl. No.: 16/056,728

(22) Filed: Aug. 7, 2018

(65) Prior Publication Data
US 2018/0343757 A1     Nov. 29, 2018

Related U.S. Application Data

(63) Continuation-in-part of application No. 15/723,376, filed on Oct. 3, 2017, now Pat. No. 10,375,846.

(30) Foreign Application Priority Data

Jan. 13, 2017  (CN) .......................... 2017 1 0025910
Oct. 16, 2017  (CN) .......................... 2017 1 0960095

(51) Int. Cl.
*H05K 5/02*     (2006.01)
*B29C 65/08*    (2006.01)
(Continued)

(52) U.S. Cl.
CPC ........... *H05K 5/0221* (2013.01); *B29C 65/08* (2013.01); *B29C 66/30221* (2013.01); *H05K 5/0013* (2013.01)

(58) Field of Classification Search
CPC .... H05K 5/066; B23K 20/10; B29C 66/1222; B29C 66/1224; B29C 66/12445;
(Continued)

(56) References Cited

U.S. PATENT DOCUMENTS 3,819,437 A * 6/1974 Paine ...................... B29C 65/08
                                                        156/73.4
5,782,370 A * 7/1998 Kamiya ............... H05K 9/0067
                                                        220/284
(Continued)

*Primary Examiner* — Hoa C Nguyen
*Assistant Examiner* — Keith DePew
(74) *Attorney, Agent, or Firm* — Rosenberg, Klein & Lee

(57) ABSTRACT

An electronic module includes first and second shells respectively having first and second edge surfaces with respective first and second joint units jointed together by ultrasonic welding. The first joint unit has first and second projection portions on the first edge surface, a first indentation portion between the first and second projection portions, and a bump on the second projection portion. The second joint unit complementarily engages the first joint unit. First and second bonding layers are respectively formed between the first indentation portion and the second joint unit and between the second projection portion and the second joint unit. Waterproof cable assemblies are mounted to the shells.

22 Claims, 10 Drawing Sheets

(51) Int. Cl.
 *B29C 65/00* (2006.01)
 *H05K 5/00* (2006.01)
(58) Field of Classification Search
 CPC .......... B29C 66/12469; B29C 66/1282; B29C 66/12841; B29C 66/30221; B29C 66/30223; B29C 66/322
 See application file for complete search history.

(56) References Cited

U.S. PATENT DOCUMENTS

| | | | | |
|---|---|---|---|---|
| 6,927,335 | B2* | 8/2005 | Lim | H02G 3/081 |
| | | | | 174/50 |
| 8,695,797 | B2* | 4/2014 | Maier | H05K 5/0013 |
| | | | | 206/320 |
| 9,434,839 | B2* | 9/2016 | Sakata | C08L 67/02 |
| 2004/0060364 | A1* | 4/2004 | Roeckel | B29C 65/0636 |
| | | | | 73/861 |
| 2008/0053700 | A1* | 3/2008 | O'Connor | B23K 20/122 |
| | | | | 174/564 |
| 2008/0278045 | A1* | 11/2008 | Fan | H05K 5/066 |
| | | | | 312/223.6 |
| 2008/0278892 | A1* | 11/2008 | Chen | H05K 5/063 |
| | | | | 361/724 |
| 2012/0135300 | A1* | 5/2012 | Ota | H01M 2/1061 |
| | | | | 429/176 |
| 2013/0050966 | A1* | 2/2013 | Frenzel | B29C 66/9292 |
| | | | | 361/759 |
| 2013/0336710 | A1* | 12/2013 | Chou | B29C 65/08 |
| | | | | 403/270 |
| 2015/0014006 | A1* | 1/2015 | Hozumi | H01H 9/04 |
| | | | | 173/46 |
| 2016/0114550 | A1* | 4/2016 | Torriani | B29C 66/30223 |
| | | | | 428/76 |
| 2016/0167288 | A1* | 6/2016 | Rodgers | B29C 65/08 |
| | | | | 156/73.1 |
| 2016/0184933 | A1* | 6/2016 | Armstrong | B23K 1/0008 |
| | | | | 220/4.01 |
| 2016/0271868 | A1* | 9/2016 | Ono | B29C 66/30221 |
| 2017/0093077 | A1* | 3/2017 | Kwan | H01R 13/504 |
| 2018/0022039 | A1* | 1/2018 | Jian | B29C 65/06 |
| | | | | 428/220 |

* cited by examiner

ELECTRONIC MODULE WITH AN IMPROVED SHELL AND METHOD FOR MAKING THE SAME

CROSS-REFERENCE TO RELATED APPLICATION

This application is a continuation-in-part (CIP) of co-pending U.S. patent application Ser. No. 15/723,376, filed on Oct. 3, 2017, which claims priority of Chinese Application No. 201710025910.9, filed on Jan. 13, 2017. This application also claims priority to Chinese Patent Application No. 201710960095.5, filed on Oct. 16, 2017.

FIELD

The disclosure relates to an electronic module, and more particularly to an electronic module with an improved shell, and a method for making the electronic module.

BACKGROUND

To meet different power specifications of numerous electronic products, various electronic modules, such as power adapters, power transformers and power connectors, have been provided in the art. Such an electronic module has a housing formed by upper and lower shells to isolate interior electronic elements from exterior dust or vapors. However, such shells do not have a joint sufficient to stop fluid flowing into the housing. In other word, such an electronic module is not waterproof. Further, the joint mechanisms used for the shells adversely affects not only appearance of the electronic module, but also the entire structural strength and electrical characteristics thereof. Therefore, it is important to provide an electronic module with shells having a proper joint mechanism that is waterproof.

SUMMARY

An object of the present disclosure is to provide an electronic module.

According to one aspect of the present disclosure, an electronic module includes a first shell and a second shell.

The first shell includes a first base wall, a first surrounding wall connected around the first base wall, a first joint unit, and a bump. The first surrounding wall has a first outer surface, a first inner surface opposite to the first outer surface, and a first edge surface connecting between the first outer and inner surfaces oppositely of the first base wall. The first joint unit is disposed on the first edge surface. The first joint unit has a first projection portion that projects from the first edge surface and that adjoins the first outer surface, a second projection portion that projects from the first edge surface and that adjoins the first inner surface, and a first indentation portion disposed between the first and second projection portions. The bump protrudes from the second projection portion oppositely of the first edge surface.

The second shell covers the first shell and includes a second base wall, a second surrounding wall connected around the second base wall, and a second joint unit. The second surrounding wall has a second outer surface, a second inner surface opposite to the second outer surface, and a second edge surface connecting between the second outer and inner surfaces oppositely of the second base wall. The second joint unit is disposed on the second edge surface. The second joint unit has a first shoulder portion aligned with the first projection portion, a third projection portion aligned with the first indentation portion, and a second shoulder portion aligned with the second projection portion.

The first and second joint units are joined with each other in such a manner that the first project ion portion, the first indentation portion and the second projection portion respectively and complementarily match the first shoulder portion, the third projection portion and the second shoulder portion.

Another object of the present disclosure is to provide a first shell for coupling with a second shell.

According to another aspect of the present disclosure, a first shell for coupling a second shell includes a first base wall, a first surrounding wall, a first joint unit and a bump.

The first surrounding wall is connected around the first base wall. The first surrounding wall has a first outer surface, a first inner surface opposite to the first outer surface, and a first edge surface connecting between the first outer and inner surfaces.

The first joint unit is disposed on the first edge surface for joining with the second shell. The first joint unit has a first projection portion that projects from the first edge surface and that adjoins the first outer surface, a second projection portion that projects from the first edge surface and that adjoins the first inner surface, and a first indentation portion disposed between the first and second projection portions.

The bump protrudes from the second projection portion oppositely of the first edge surface.

Still another object of the present disclosure is to provide a method of producing an electronic module.

According to still another aspect of the present disclosure, a method of producing an electronic module includes:

producing a first shell, the first shell including a first base wall, a first surrounding wall connected around the first base wall, a first joint unit, and a bump, the first surrounding wall having a first outer surface, a first inner surface opposite to the first outer surface, and a first edge surface connecting between the first outer and inner surfaces oppositely of the first base wall, the first joint unit being disposed on the first edge surface, the first joint unit having a first projecting portion that projects from the first edge surface and that adjoins the first outer surface, a second projection portion that projects from the first edge surface and that adjoins the first inner surface, and a first indentation portion disposed between the first and second projection portions, the bump protruding from the second projection portion oppositely of the first edge surface;

producing a second shell, the second shell including a second base wall, a second surrounding wall connected around the second base wall, and a second joint unit, the second surrounding wall having a second outer surface, a second inner surface opposite to the second outer surface, and a second edge surface connecting between the second outer and inner surfaces oppositely of the second base wall, the second joint unit being disposed on the second edge surface, the second joint unit having a first shoulder portion, a third projection portion, and a second shoulder portion; and joining the first shell with the second shell, which includes joining the first joint unit with the second joint unit by respectively placing the first projection portion, the first indentation portion and the second projection portion in face to face alignment with the first shoulder portion, the third projection portion and the second shoulder portion and by forming a first bonding layer between the first indentation portion and the third projection portion and a second bonding layer between the second projection portion and the second shoulder portion.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
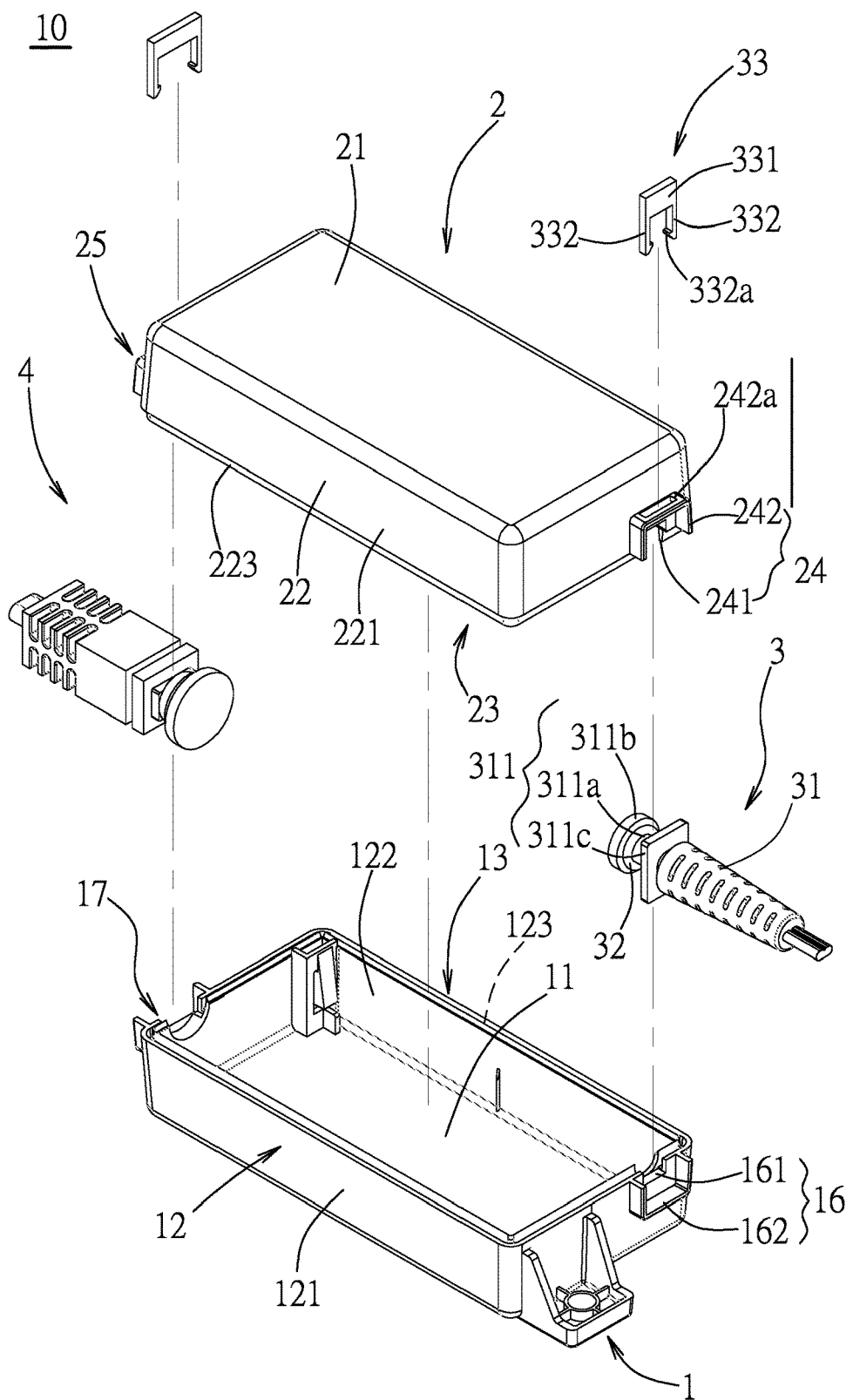
FIG. 1 is an exploded view of an electronic module according to an embodiment of the present disclosure.
Figure 2:
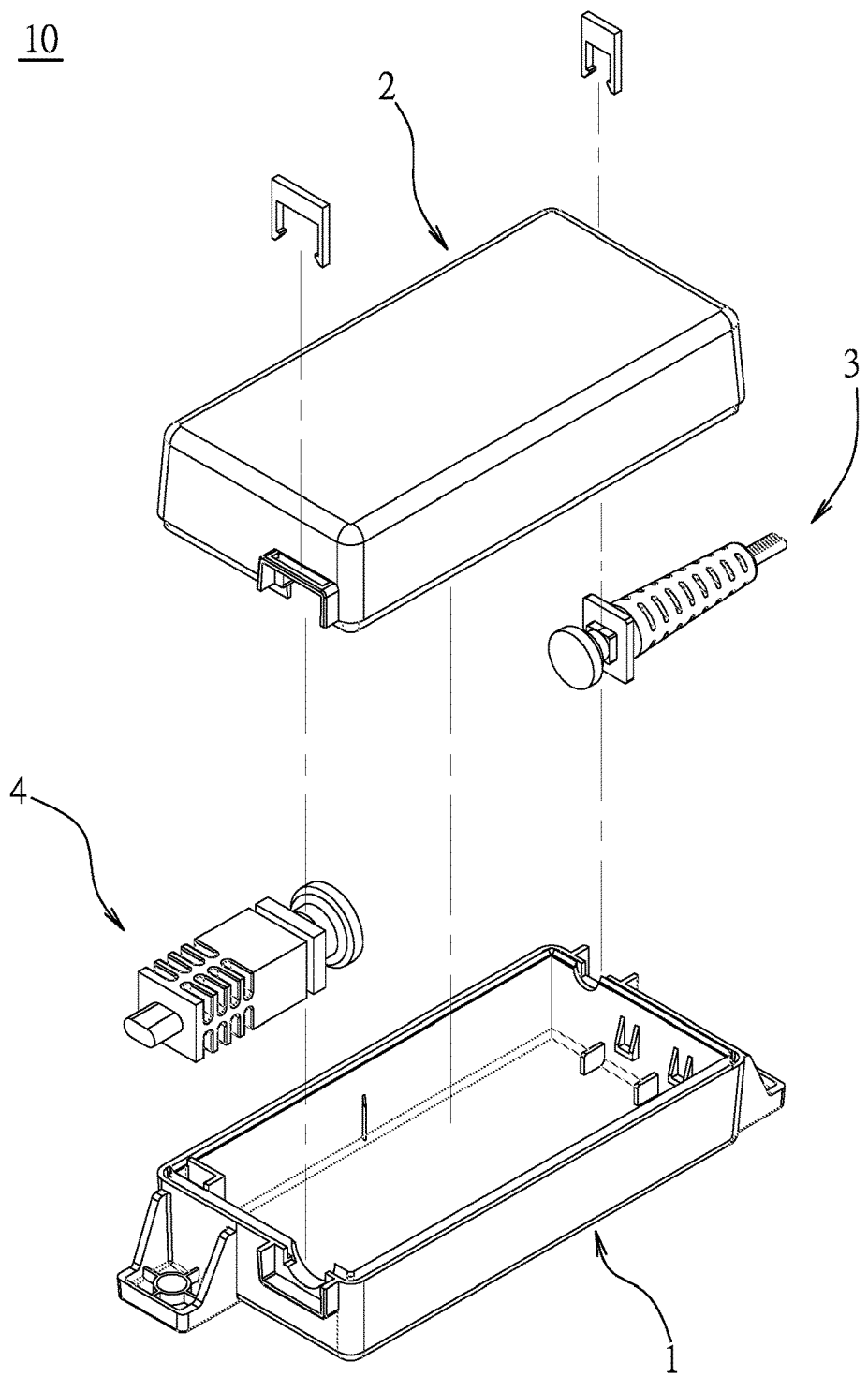
FIG. 2 is an exploded view similar to FIG. 1, but taken from a different angle.
Figure 3:
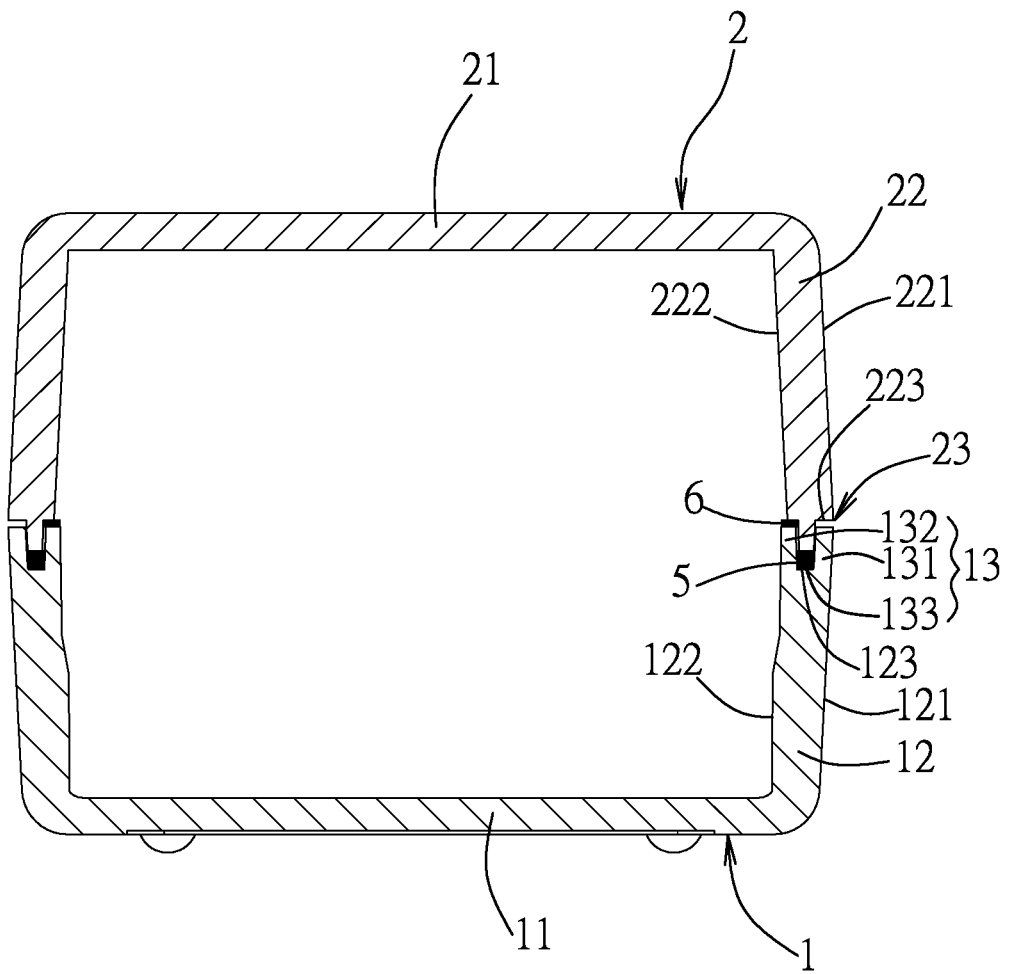
FIG. 3 is a sectional view of the embodiment.
Figure 4:
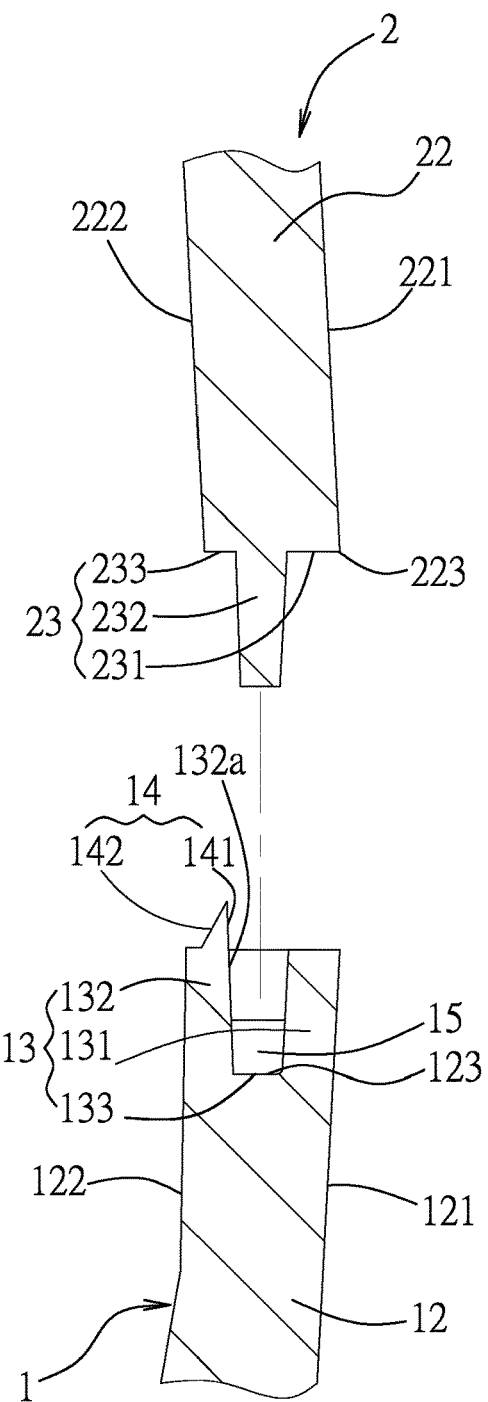
FIG. 4 is an enlarged fragmentary section view of the embodiment, illustrating a first shell and a second shell of the electronic module before join.
Figure 5:
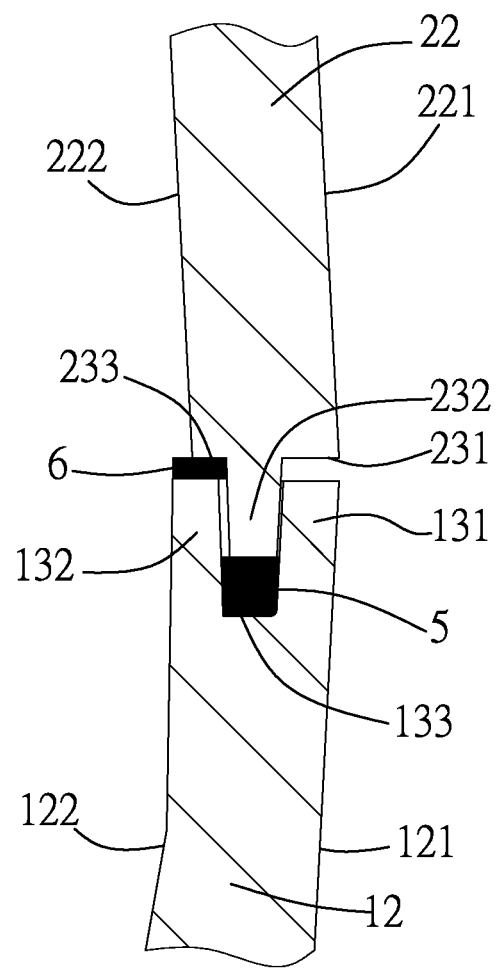
FIG. 5 is an enlarged fragmentary sectional view of the embodiment, illustrating the first shell and the second shell of the electronic module joined to each other.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIGS. 1 to 5, an electronic module 10 according to an embodiment of the present disclosure includes a first shell 1, a second shell 2, a first waterproof cable assembly 3, and a second waterproof cable assembly 4. In this embodiment, while not shown, an integrated circuit board with electronic components is disposed within the first shell 1.

The first shell 1 includes a first base wall 11, a first surrounding wall 12 connected around the first base wall 11, a first joint unit 13, and a bump 14. In this embodiment, but not limited thereto, the first surrounding wall 12 is four-sided. The first surrounding wall 12 has a first outer surface 121, a first inner surface 122 opposite to the first outer surface 121, and a first edge surface 123 connecting between the first outer and inner surfaces 121, 122 oppositely of the first base wall 11. The first joint unit 13 is disposed on the first edge surface 123. The first joint unit 13 has a first projection portion 131 that projects from the first edge surface 123 and that adjoins the first outer surface 121, a second projection portion 132 that projects from the first edge surface 123 and that adjoins the first inner surface 122, and a first indentation portion 133 disposed between the first and second projection portions 131, 132. The bump 14 is a loop-shaped bump formed on the first shell 1. In this embodiment, the bump 14 protrudes from the second projection portion 132 in a direction away from the first edge surface 123 and extends along an entire length of the second projection portion 132. However, the configuration of the bump 14 is not limited only to this embodiment. In addition, while the number of the bump 14 is one in this embodiment, the number of the bump 14 is not limited thereto.

Notably, the bump 14 forms a substantially triangular prism and is tapered in a direction opposite to the first edge surface 123 of the first surrounding wall 12. In this embodiment, the second projection portion 132 of the first joint unit 13 has a second projection surface 132a extending oppositely of the first inner surface 122 and adjoining the first indentation portion 133. The bump 14 has a bump outer surface 141 coplanar with and extending outwardly from an outer end of the second projection surface 132a opposite to the first edge surface 123, and a bump inner surface 142 inclined with the bump outer surface 141 and having one end connected to the bump outer surface 141 and another end connected to an outer end of the second projection portion 132 of the first joint unit 13 opposite to the first edge surface 123. While the bump 14 forms a substantially triangular prism in this embodiment, it is not limited hereto.

Figure 6:
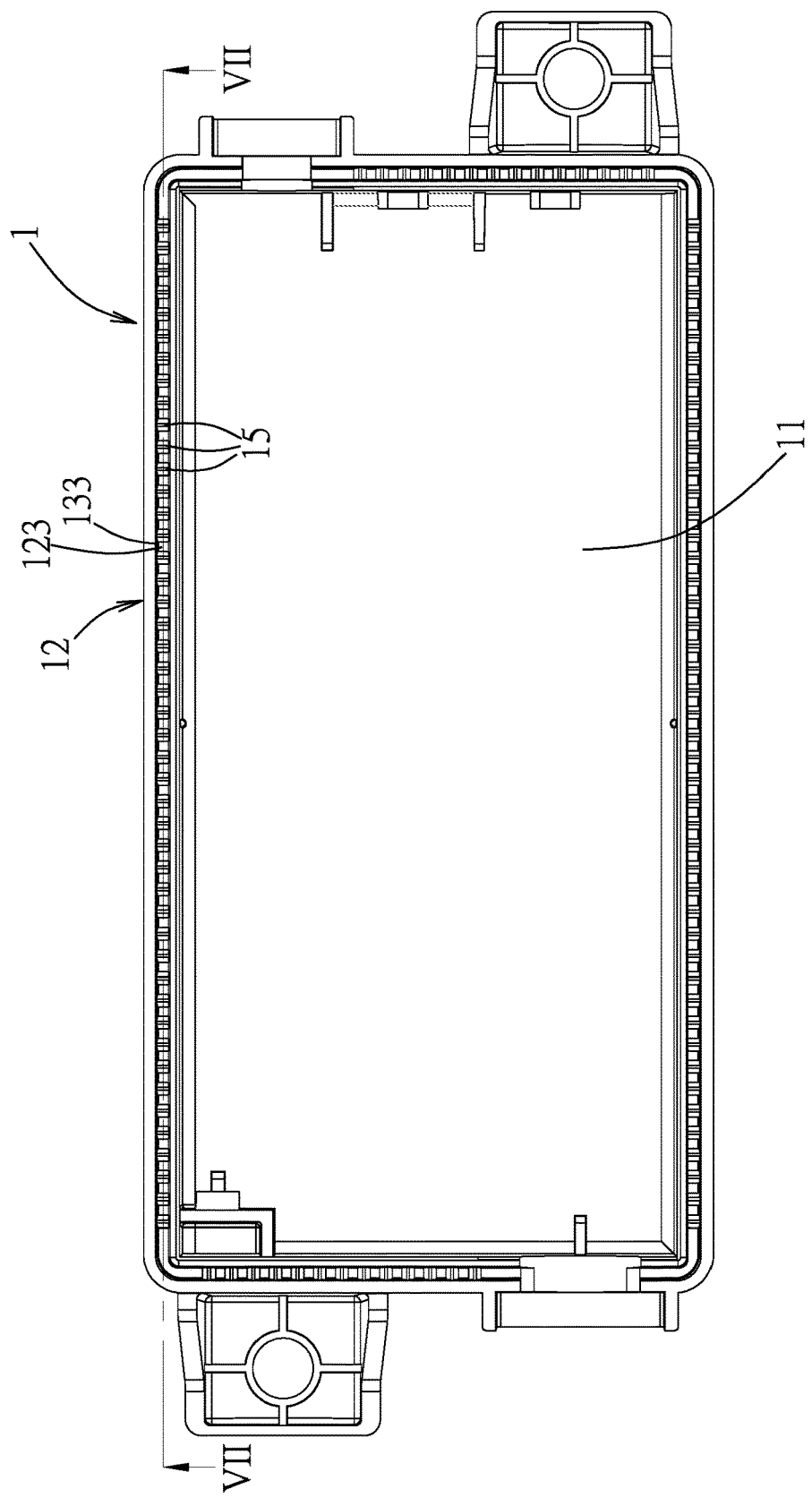
FIG. 6 is a top view of the first shell of the embodiment.
Figure 7:
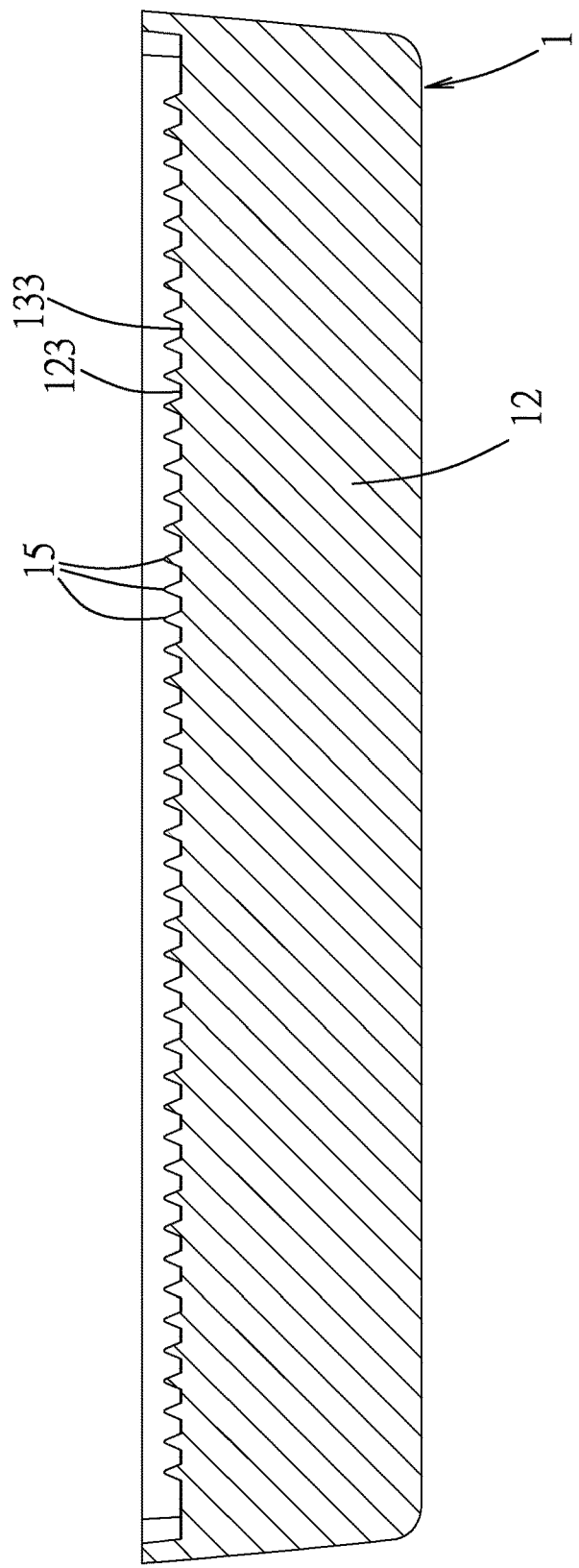
FIG. 7 is a sectional view taken along line VII-VII of FIG. 6.

Referring to FIGS. 6 and 7, the first shell 1 further includes a plurality of ribs 15 protruding from the first edge surface 123 within the first indentation portion 133 of the first joint unit 13. Each rib 15 is shorter than the first projection portion 131 and the second projection portion 132 of the first joint unit 13. In an alternative embodiment of the present disclosure, the ribs 15 may protrude from the second shell 2, or may be omitted.

Further, the ribs 15 are parallel and equidistantly spaced apart from each other and are transverse to the first inner surface 122. Each rib 15 is tapered in a direction away from the first edge surface 123 and forms, but not limited to, a substantially triangular prism. In addition, while the ribs 15 of this embodiment protrude from the first edge surface 123 on four sides of the surrounding wall 12, the ribs 15 can protrude from at least parts of the first edge surface 123 located on at least two sides of the surrounding wall 12.

The second shell 2 covers the first shell 1 and includes a second base wall 21, a second surrounding wall 22 connected around the second base wall 21, and a second joint unit 23. The second surrounding wall 22 has a second outer surface 221, a second inner surface 222 opposite to the second outer surface 221, and a second edge surface 223 connecting between the second outer and inner surfaces 221, 222 oppositely of the second base wall 21. The second joint unit 23 is disposed on the second edge surface 223 to be joined with the first joint unit 13. In this embodiment, the second joint unit 23 has a first shoulder portion 231, a third projection portion 232, and a second shoulder portion 233 arranged sequentially from the second outer surface 221 to the second inner surface 222. The first shoulder portion 231 is aligned with the first projection portion 131 of the first joint unit 13. The third projection portion 232 is aligned with the first indentation portion 133. The second shoulder portion 233 is aligned with the second projection portion 132. In such a manner, the first projection portion 131, the first indentation portion 133 and the second projection portion 132 respectively and complementarily match the first shoulder portion 231, the third projection portion 232 and the second shoulder portion 233.

Figure 8:
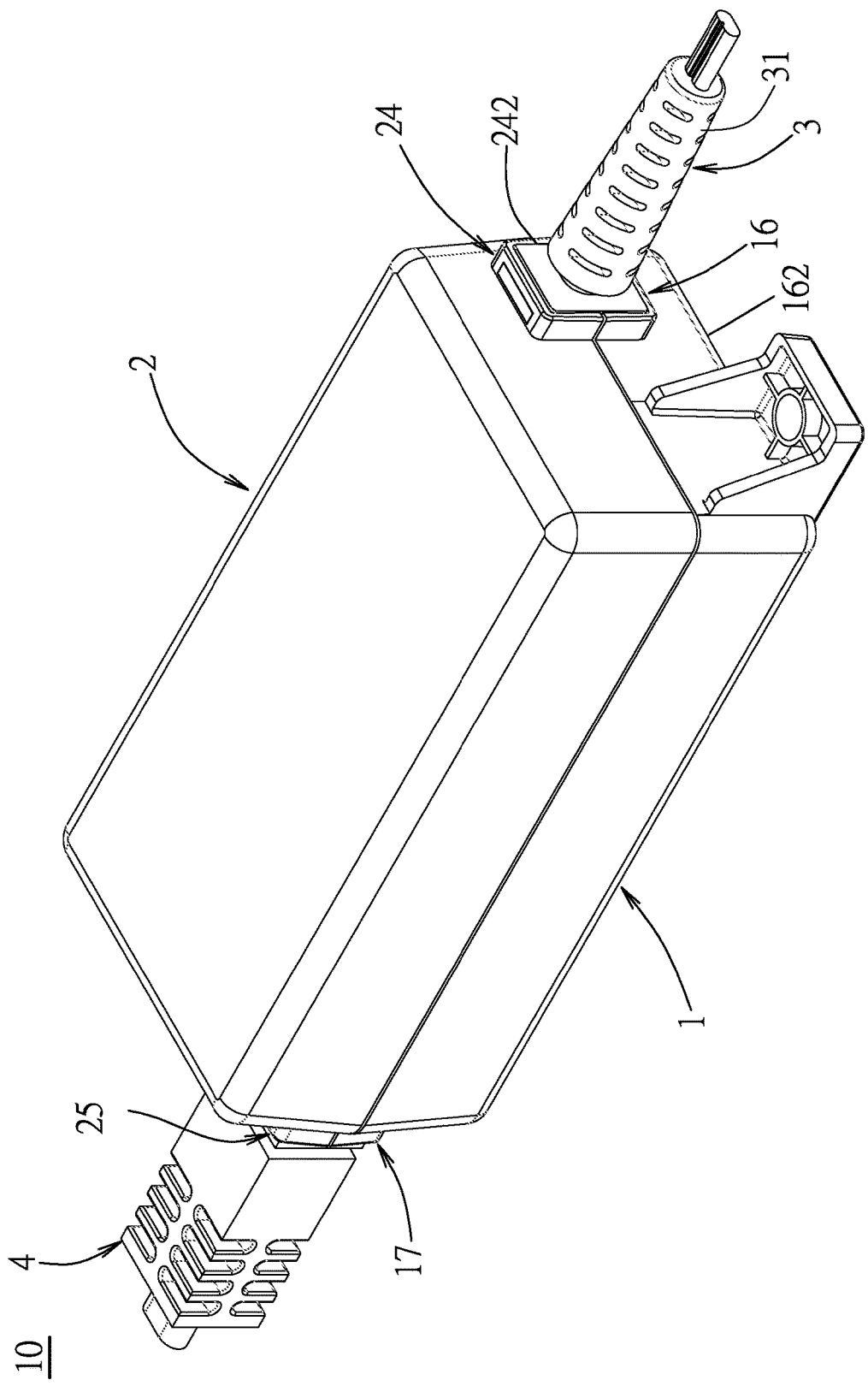
FIG. 8 is a perspective view of the embodiment.
Figure 9:
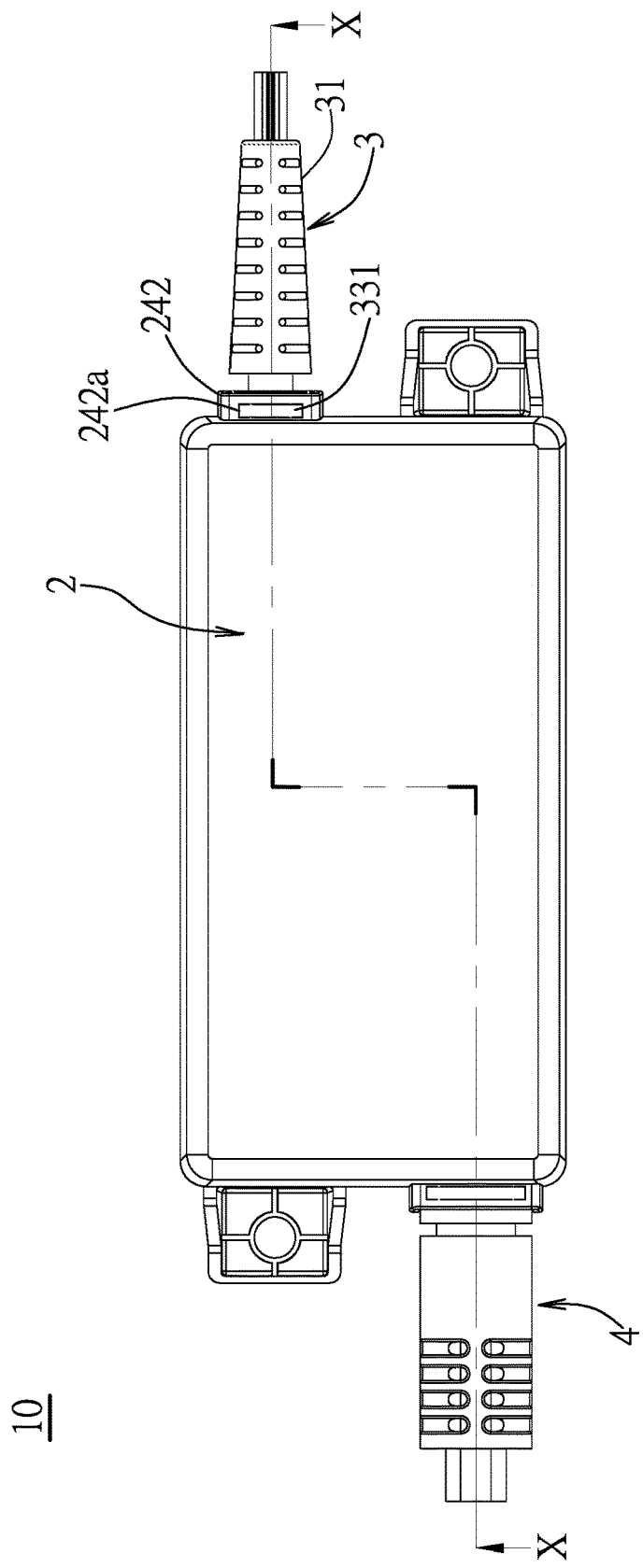
FIG. 9 is a top view of the embodiment.
Figure 10:
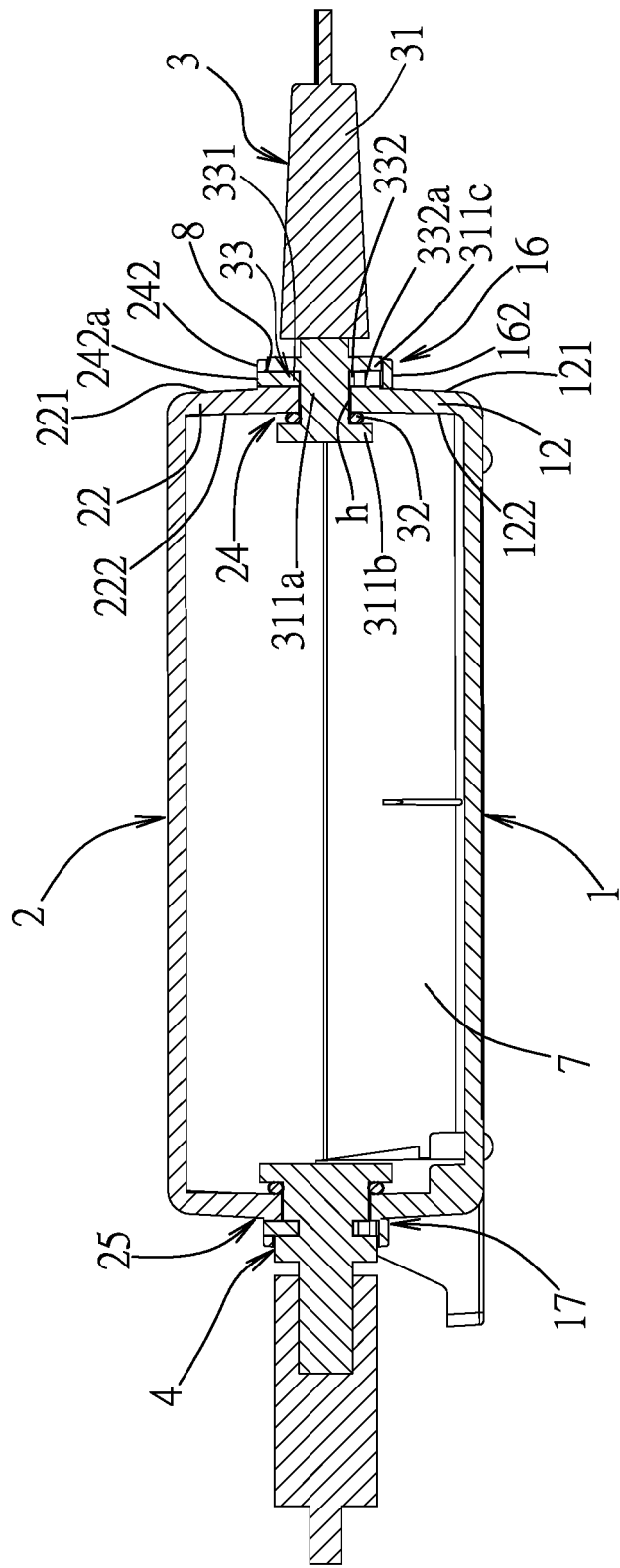
FIG. 10 is a sectional view taken along line X-X of FIG. 9.

Referring to FIGS. 8 to 10, in combination with FIG. 1, the first waterproof cable assembly 3 includes a first cable 31, a first seal ring 32 and a first engagement member 33. The first cable 31 has a first cable portion 311. The first cable portion 311 has a first mounting cable segment 311a, a first inner stop segment 311b and a first outer stop segment 311c. The first inner and outer stop segments 311b, 311c are disposed respectively on two opposite sides of the first cable mounting segment 311a. Each of the first inner and outer stop segments 311b, 311c has a width greater than an outer diameter of the first mounting cable segment 311a. The first seal ring 32 is disposed around the first cable mounting segment 311*a* proximately of the first inner stop segment 311*b* and between the first inner and outer stop segments 311*b*, 311*c*.

In this embodiment, the first shell 1 further includes a first cable receiving unit 16. The first cable receiving unit 16 includes a first cable recess 161 that is indented from the first edge surface 123 of the first surrounding wall 12 and that extends transversely through the first outer and inner surfaces 121, 122 of the surrounding wall 12. The second shell 2 further includes a second cable receiving unit 24 to combine with the first cable receiving unit 16. The second cable receiving unit 24 includes a second cable recess 241 that is indented from the second edge surface 223 of the second surrounding wall 22 and that extends transversely through the second outer and inner surfaces 221, 222. The first and second cable recesses 161, 241 complement each other to form a hole (h) generally conforming to a cross section of the first cable mounting segment 311*a* and receiving a portion of the first cable mounting segment 311*a* between the first seal ring 32 and the first outer stop segment 311*c* such that each of the first and second surrounding walls 12, 22 is located between the first seal ring 32 and the first outer stop segment 311*c*. The first engagement member 33 is wedged between the first surrounding wall 12 and the first outer stop segment 311*c* and between the second surrounding wall 22 and the first outer stop segment 311*c* and engages the first cable mounting segment 311*a* such that the first seal ring 32 is compressed to seal a clearance between the first cable mounting segment 311*a* and the first surrounding wall 12 and between the first cable mounting segment 311*a* and the second surrounding wall 22. In this embodiment, a sum of original thicknesses of the first seal ring 32, the first or second surrounding wall 12 or 22 and the first engagement member 33 is slightly greater than a distance between the first inner stop segment 311*b* and the first outer stop segment 311*c*. Therefore, the first ring 32 is tightly compressed between the first inner stop segment 311*b* and the first inner surface 122 and between the first inner stop segment 311*b* and the second inner surface 222 after the first engagement member 33 is placed in its wedged position. An inner space 7 surrounded by the first and second shells 1, 2 is isolated from the ambient environment.

As shown in FIGS. 1 and 10, the engagement member 33 has a bridge section 331 lying over and engaging a top side of said first cable mounting segment 311*a* and two first resilient engagement arms 332 extending respectively and downwardly from two opposite sides of the bridge section 331 to engage two opposite sides of said first cable mounting segment 311*a*. The first resilient engagement arms 332 respectively have barb portions 332*a* engaging a bottom side of the first cable mounting segment 311*a*. The barb portions 332*a* are slanted inwardly in two opposite inward directions, respectively. The first cable receiving unit 16 further includes a first limit wall 162 extending outwardly from the first outer surface 121 of the first surrounding wall 12 and around the first cable recess 161. The second cable unit 24 further includes a second limit wall 242 extending outwardly from the second outer surface 221 of the second surrounding wall 22 and around the second cable recess 241. The first limit wall 162 and the second limit wall 242 complement each other to surround a limit space 8 that is adjacent to the first and second outer surfaces 121, 221 and that receives the first outer stop segment 311*c* of the first cable 31 and the first engagement member 33. The second limit wall 242 has an insertion hole 242*a* that is disposed proximally to the second outer surface 221 and distally from the second edge surface 223 of the second surrounding wall 22 and that communicates with the limit space 8. The first engagement member 33 is inserted into the limit space 8 through the insertion hole 242*a*.

The second waterproof cable assembly 4 is structurally similar to the first waterproof cable assembly 3. The first shell 1 further includes a third cable receiving unit 17 that is structurally similar to the first cable receiving unit 16. The second shell 2 further includes a fourth cable receiving unit 25 that is structurally similar to the second cable receiving unit 24. The third and fourth cable receiving units 17, 25 complementarily match each other to allow the second waterproof cable assembly 4 to extend into the space 7. In this embodiment, while the third and fourth cable receiving units 17, 25 are located oppositely of the first and second cable receiving units 16, 24, the disposition thereof is not limited hereto. In addition, the number of the waterproof cable assemblies and the cable receiving units are not limited hereto.

Referring back to FIGS. 1, 3, 4 and 5, the first and second shells 1, 2 are coupled with each other by ultrasonic welding to join the first and second joint units 13, 23. In this embodiment, the first joint unit 13 of the first shell 1 is aligned and contacts with the second joint unit 23 of the second shell 2. In other words, the first projection portion 131, the first indentation portion 133 and the second projection portion 132 of the first joint unit 13 are placed in face to face alignment or contact with and complementarily match the first shoulder portion 231, the third projection portion 232 and the second shoulder portion 233 of the second joint unit 23, respectively. By ultrasonic welding that simultaneously causes the ribs 15 and the bump 14 to frictionally rub the second joint unit 23 and to melt between the first and second joint units 13, 23, a first bonding layer 5 is formed between the first indentation portion 133 of the first joint unit 13 and the third projection portion 232 of the second joint unit 23, and a second bonding layer 6 is formed between the second projection portion 132 of the first joint unit 13 and the second shoulder portion 233 of the second joint unit 2. By virtue of the first bonding layer 5 that joins the first and second joint units 13, 23 and the second bonding layer 6 that enhances the joint between the first and second joint units 13, 23, fluid (such as vapors, glue, melt etc.) can be prevented from entering the inner space 7 of the electronic module 10. Furthermore, the phenomenon of melt overflow can be prevented if the first and second joint units 13, 23 deeply mesh with each other. Incase the level of the intermeshing of the first and second joint units 13, 23 is shallow, when undergoing drop and falling ball tests, the electronic module 10 is still able to pass the tests. Therefore, the connection between the first and second joint units 13, 23 not only enables the electronic module 10 to pass the drop and falling ball tests, but al so prevents fluid from entering therein. Further, the second bonding layer 6 formed by the bump 14 is capable of avoiding problems of electro-static discharge (ESD). In this embodiment, while the first and second shells 1, 2 are joined with each other by ultrasonic welding, the way of joining the first and second sells 1, 2 is not limited hereto. In addition, if the ribs 15 are to be omitted, the first and second shells 1, 2 may be bonded to each other with adhesive. For example, the first indentation portion 133 may fill with an adhesive to adhere the first and second shells 1, 2 together.

Referring back to FIGS. 1, 8, 9 and 10, because it is the same to install the first and second waterproof cable assemblies 3, 4, herein exemplified is installation of the first waterproof cable assembly 3. First, the first cable portion 311 of the first cable 31 surrounded by the first seal ring 32 is placed in the first cable receiving unit 16. In this situation, the first cable mounting segment 311a is placed in the first cable recess 161. The first inner stop segment 311b and the first seal ring 32 are disposed proximally of the first inner surface 122, and the first seal ring 32 is disposed between the first inner stop segment 311b and the first inner surface 122. The first outer stop segment 311c is disposed proximally of the first outer surface 121. Subsequently, the first and second shells 1, 2 are joined with each other by ultrasonic welding, such that the first and second cable recesses 161, 241 complement each other to form the hole (h). The first cable mounting segment 311a extends through the hole (h). The first inner stop segment 311b and the first seal ring 32 are disposed inwardly of the first and second surrounding walls 12, 22, and the first outer stop segment 311c is disposed outwardly of the first and second surrounding walls 12, 22 and received within the limit space 8. Afterwards, the first cable 31 is pulled outward in a direction away from the first and second outer surfaces 121, 221 so that the first inner stop segment 311b, the first inner surface 122 and the second inner surface 222 cooperatively compress the first seal ring 32, and a distance of the first outer stop segment 311c from the first and second outer surfaces 121, 222 is enlarged. At this stage, through the insertion hole 242a of the second limit wall 242, the first engagement member 33 is inserted into the limit space 8 and is wedged between the first outer surface 121 and the first outer stop segment 311c and between the second outer surface 222 and the first outer stop segment 311c, and the engagement member 33 therefore engages the first cable mounting segment 311a. The bridge section 331 of the first engagement member 33 is situated in the insertion hole 242a. The first engagement member 33 provides a pressure that compresses the first seal ring 32 via the first inner stop segment 311b and the first and second inner surfaces 122, 222 to seal the clearance between the first cable mounting segment 311a and the first inner surface 122 and between the first cable mounting segment 311a and the second inner surface 222, thereby preventing a fluid from flowing into the inner space 7.

Notably, in this embodiment, the electronic module 10 is, but not limited to, a voltage converter and further includes a voltage converting unit (not shown) connecting between the first and second waterproof cable assemblies 3, 4.

In summary, because the first and second bonding layers 5, 6 are formed by ultrasonic welding which causes the ribs 15 and the bump 14 to frictionally rub the second joint 23 and to melt between the first and second joint units 13, 23, not only the joining structure of the electronic module 10 can be strengthened, but the ESD problem can be avoided. Further, by virtue of the structural arrangement of the first and second shells 1, 2 cooperating with the first and second waterproof cable assemblies 3, 4, the clearance formed between the first and second shells 1, 2 is sealed to prevent a fluid from flowing therethrough into the electronic module 10.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. An electronic module, comprising:
a first shell including a first base wall, a first surrounding wall connected around said first base wall, a first joint unit, and a bump, said first surrounding wall having a first outer surface, a first inner surface opposite to said first outer surface, and a first edge surface connecting between said first outer and inner surfaces oppositely of said first base wall, said first joint unit disposed on said first edge surface, said first joint unit having a first projection portion that projects from said first edge surface and that adjoins said first outer surface, a second projection portion that projects from said first edge surface and that adjoins said first inner surface, and a first indentation portion disposed between said first and second projection portions, said bump protruding from said second projection portion oppositely of said first edge surface; and
a second shell covering said first shell and including a second base wall, a second surrounding wall connected around said second base wall, and a second joint unit, said second surrounding wall having a second outer surface, a second inner surface opposite to said second outer surface, and a second edge surface connecting between said second outer and inner surfaces oppositely of said second base wall, said second joint unit disposed on said second edge surface, said second joint unit having a first shoulder portion, a third projection portion, and a second shoulder portion;
wherein said first and second joint units are joined with each other in such a manner that said first projection portion, said first indentation portion and said second projection portion respectively and complementarily match said first shoulder portion, said third projection portion and said second shoulder portion.

2. The electronic module as claimed in claim 1, wherein said first shell further includes a plurality of ribs protruding from said first edge surface within said first indentation portion, each of said ribs being shorter than said first projection portion and said second projection portion.

3. The electronic module as claimed in claim 2, wherein a first bonding layer is formed between said first indentation portion of said first joint unit and said third projection portion of said second joint unit, and a second bonding layer is formed between said second projection portion of said first joint unit and said second shoulder portion of said second joint unit by ultrasonic welding, which causes said ribs and said bump to frictionally rub said second joint unit and to melt between the first and second joint units.

4. The electronic module as claimed in claim 2, wherein said bump is tapered in a direction opposite to said first edge surface of said first surrounding wall.

5. The electronic module as claimed in claim 4, wherein said bump forms a substantially triangular prism.

6. The electronic module as claimed in claim 5, wherein said second projection portion of said first joint unit has a second projection surface extending oppositely of said first inner surface and adjoining said first indentation portion, said bump having a bump outer surface extending outwardly from an outer end of said second projection surface opposite to said first edge surface, and a bump inner surface inclined with said bump outer surface and having one end connected to said bump outer surface and another end connected to an outer end of said second projection portion of said first joint unit opposite to said first edge surface.

7. The electronic module as claimed in claim 2, further comprising:
a first waterproof cable assembly that includes a first cable, a first seal ring and a first engagement member, said first cable having a first cable portion, said first cable portion having a first cable mounting segment, a first inner stop segment and a first outer stop segment, said first inner and outer stop segments being disposed respectively on two opposite sides of said first cable mounting segment, each of said first inner and outer stop segments having a width greater than an outer diameter of said first cable mounting segment, said first seal ring disposed around said first cable mounting segment proximately of said first inner stop segment and between said first inner and outer stop segments;
said first shell further including a first cable receiving unit, said first cable receiving unit including a first cable recess that is indented from said first edge surface of said first surrounding wall and that extends through said first outer and inner surfaces of said first surrounding wall;
said second shell further including a second cable receiving unit to combine with said first cable receiving unit, said second cable receiving unit including a second cable recess that is indented from said second edge surface of said second surrounding wall and that extends through said second outer and inner surfaces;
said first and second cable recesses complementing each other to form a hole conforming to a cross section of said first cable mounting segment and receiving a portion of said first cable mounting segment between said first seal ring and said first outer stop segment such that each of said first and second surrounding walls is located between said first seal ring and said first outer stop segment, said first engagement member being wedged between said first surrounding wall and said first outer stop segment and between said second surrounding wall and said first outer stop segment and engaging said first cable mounting segment such that said first seal ring is compressed to seal a clearance between said first cable mounting segment and said first surrounding wall and between said first cable mounting segment and said second surrounding wall.

8. The electronic module as claimed in claim 7, wherein said first engagement member has a bridge section lying over a top side of said first cable mounting segment and two first resilient engagement arms extending respectively and downwardly from two opposite sides of said bridge section to engage two opposite sides of said first cable mounting segment, said first resilient engagement arms respectively having barb portions engaging a bottom side of said first cable mounting segment, said barb portions being slanted inwardly in two opposite inward directions, respectively.

9. The electronic module as claimed in claim 7, wherein said first cable receiving unit further includes a first limit wall extending outwardly from said first outer surface of said first surrounding wall and around said first cable recess, said second cable unit further including a second limit wall extending outwardly from said second outer surface of said second surrounding wall and around said second cable recess, said first limit wall and said second limit wall complementing each other to surround a limit space that is adjacent to said first and second outer surfaces and that receives said first outer stop segment of said first cable and said first engagement member, said second limit wall having an insertion hole that is disposed proximally to said second outer surface and distally from said second edge surface of said second surrounding wall and that communicates with said limit space, said first engagement member being inserted into said limit space through said insertion hole.

10. The electronic module as claimed in claim 2, wherein said ribs are parallel and equidistantly spaced apart from each other and are transverse to said first inner surface, each of said ribs being tapered in a direction away from said first edge surface and forming a substantially triangular prism.

11. The electronic module as claimed in claim 10, wherein said first surrounding wall is four-sided, said ribs protruding from at least parts of said first edge surface located on two sides of said surrounding wall.

12. The electronic module as claimed in claim 1, further comprising:
a first waterproof cable assembly that includes a first cable, a first seal ring and a first engagement member, said first cable having a first cable portion, said first cable portion having a first cable mounting segment, a first inner stop segment and a first outer stop segment, said first inner and outer stop segments being disposed respectively on two opposite sides of said first cable mounting segment, each of said first inner and outer stop segments having a width greater than an outer diameter of said first cable mounting segment, said first seal ring disposed around said first cable mounting segment proximately of said first inner stop segment and between said first inner and outer stop segments;
said first shell further including a first cable receiving unit, said first cable receiving unit including a first cable recess that is indented from said first edge surface of said first surrounding wall and that extends through said first outer and inner surfaces of said first surrounding wall;
said second shell further including a second cable receiving unit to combine with said first cable receiving unit, said second cable receiving unit including a second cable recess that is indented from said second edge surface of said second surrounding wall and that extends through said second outer and inner surfaces;
said first and second cable recesses complementing each other to form a hole conforming to a cross section of said first cable mounting segment and receiving a portion of said first cable mounting segment between said first seal ring and said first outer stop segment such that each of said first and second surrounding walls is located between said first seal ring and said first outer stop segment, said first engagement member being wedged between said first surrounding wall and said first outer stop segment and between said second surrounding wall and said first outer stop segment and engaging said first cable mounting segment such that said first seal ring is compressed to seal a clearance between said first cable mounting segment and said first surrounding wall and between said first cable mounting segment and said second surrounding wall.

13. A first shell for coupling with a second shell, the first shell comprising:
a first base wall;
a first surrounding wall connected around said first base wall, said first surrounding wall having a first outer surface, a first inner surface opposite to said first outer surface, and a first edge surface connecting between said first outer and inner surfaces;
a first joint unit disposed on said first edge surface for joining with the second shell, said first joint unit having a first projection portion that projects from said first edge surface and that adjoins said first outer surface, a second projection portion that projects from said first edge surface and that adjoins said first inner surface, and a first indentation portion disposed between said first and second projection portions, said first joint unit further including a plurality of ribs protruding from said first edge surface within said first indentation portion, said plurality of ribs being disposed in spaced-parallel relationship within said first indentation portion, each of said ribs extending fully between said first and second projections portions within said first indentation portion, and each of said ribs being shorter than said first projection portion and said second projection; and
a bump protruding from said second projection portion oppositely of said first edge surface.

14. The first shell as claimed in claim 13, wherein said bump is tapered in a direction away from said first edge surface of said first surrounding wall.

15. The first shell as claimed in claim 14, wherein said bump forms a substantially triangular prism.

16. The first shell as claimed in claim 15, wherein said second projection portion of said first joint unit has a second projection surface extending oppositely of said first inner surface and adjoining said first indentation portion, said bump having a bump outer surface extending outwardly from an outer end of said second projection surface opposite to said first edge surface, and a bump inner surface inclined with said bump outer surface and having one end connected to said bump outer surface and another end connected to an outer end of said second projection portion of said first joint unit opposite to said first edge surface.

17. The first shell as claimed in claim 13, wherein said plurality of ribs are equidistantly spaced apart from each other and extend transversely with respect to said first inner surface, and each of said ribs being tapered in a direction away from said first edge surface and forming a substantially triangular prism.

18. The first shell as claimed in claim 17, wherein said first surrounding wall is four-sided, said plurality of ribs protruding from at least parts of said first edge surface located on two sides of said first surrounding wall.

19. A method of producing an electronic module, comprising:
producing a first shell, the first shell including a first base wall, a first surrounding wall connected around the first base wall, a first joint unit, and a bump, the first surrounding wall having a first outer surface, a first inner surface opposite to the first outer surface, and a first edge surface connecting between the first outer and inner surfaces oppositely of the first base wall, the first joint unit being disposed on the first edge surface, the first joint unit having a first projection portion that projects from the first edge surface and that adjoins the first outer surface, a second projection portion that projects from the first edge surface and that adjoins the first inner surface, and a first indentation portion disposed between the first and second projection portions, the bump protruding from the second projection portion oppositely of the first edge surface;
producing a second shell, the second shell including a second base wall, a second surrounding wall connected around the second base wall, and a second joint unit, the second surrounding wall having a second outer surface, a second inner surface opposite to the second outer surface, and a second edge surface connecting between the second outer and inner surfaces oppositely of the second base wall, the second joint unit being disposed on the second edge surface, the second joint unit having a first shoulder portion, a third projection portion, and a second shoulder portion; and
joining the first shell with the second shell, which includes joining the first joint unit with the second joint unit by respectively placing the first projection portion, the first indentation portion and the second projection portion in face to face alignment with the first shoulder portion, the third projection portion and the second shoulder portion and by forming a first bonding layer between the first indentation portion and the third projection portion and a second bonding layer between the second projection portion and the second shoulder portion.

20. The method of producing an electronic module as claimed in claim 19, wherein the first shell further includes a plurality of ribs protruding from the first edge surface within the first indentation portion, each of the ribs being shorter than the first projection portion and the second projection.

21. The method of producing an electronic module as claimed in claim 20, wherein, in the step of joining the first shell with the second shell, the first and second bonding layers are formed by ultrasonic welding, which causes the bump and the ribs to frictionally rub the second joint unit and to melt between the first and second joint units.

22. The method of producing an electronic module as claimed in claim 19, further comprising:
providing a first waterproof cable assembly, the first waterproof cable assembly including a first cable, a first seal ring and a first engagement member, the first cable having a first cable portion, the first cable portion having a first cable mounting segment, a first inner stop segment and a first outer stop segment, the first inner and outer stop segments being disposed respectively on two opposite sides of the first cable mounting segment, each of the first inner and outer stop segments having a width greater than an outer diameter of the first cable mounting segment, the first seal ring being disposed around the first cable mounting segment between the first inner and outer stop segments and located proximately of the first inner stop segment;
providing the first shell with a first cable receiving unit, the first cable receiving unit including a first cable recess that is indented from the first edge surface of the first surrounding wall and that extends through the first outer and inner surfaces of the first surrounding wall;
providing the second shell with a second cable receiving unit adjacent to the first cable receiving unit, the second cable receiving unit including a second cable recess that is indented from the second edge surface of the second surrounding wall and that extends through the second outer and inner surfaces, bringing together the first and second shells such that the first and second cable recesses complement each other to form a hole, and placing the first cable portion surrounded by the first seal ring between the first and second cable recesses such that the first cable mounting segment extends through the hole, the first inner stop segment and the first seal ring being disposed inwardly of the first and second surrounding walls, and the first outer stop segment being disposed outwardly of the first and second surrounding walls, the hole formed by the first and second cable recesses conforming in shape to the first cable mounting segment; and wedging the first engagement member between the first surrounding wall and the first outer stop segment and between the second surrounding wall and the first outer stop segment and placing the first engagement member around and in engagement with the first cable mounting segment, wherein the first engagement member provides a pressure that compresses the first seal ring to seal a clearance between the first cable mounting segment and the first surrounding wall and between the first cable mounting segment and the second surrounding wall.

\* \* \* \* \*